United States Patent [19]

Kotaki et al.

[11] Patent Number: 5,205,905
[45] Date of Patent: Apr. 27, 1993

[54] DRY ETCHING METHOD FOR SEMICONDUCTOR

[75] Inventors: Masahiro Kotaki; Katsuhide Manabe; Masaki Mori, all of Inazawa; Masafumi Hashimoto, Nagoya, all of Japan

[73] Assignees: Toyoda Gosei Co., Ltd., Nishikasugai; Kabushiki Kaisha Toyota Chuo Kenkyusho, Aichi, both of Japan

[21] Appl. No.: 708,883

[22] Filed: May 30, 1991

[30] Foreign Application Priority Data

May 30, 1990 [JP] Japan .................... 2-140740

[51] Int. Cl.[5] ............................. H01L 21/00
[52] U.S. Cl. .................... 156/662; 156/643; 156/646; 156/651
[58] Field of Search ............. 156/643, 646, 662, 651

[56] References Cited

U.S. PATENT DOCUMENTS

| | | | |
|---|---|---|---|
| 4,370,195 | 1/1983 | Halon et al. | 156/643 |
| 4,569,718 | 2/1986 | Butherus et al. | 156/643 |
| 4,617,193 | 10/1986 | Wu | 156/643 |
| 4,635,343 | 1/1987 | Kuroda | 156/646 |
| 4,640,737 | 2/1987 | Nagasaka et al. | 156/643 |
| 4,855,249 | 8/1989 | Akasaki et al. | 437/84 |
| 4,911,102 | 3/1990 | Manabe et al. | 118/715 |
| 4,946,548 | 8/1990 | Kotaki et al. | 156/643 |
| 4,985,113 | 1/1991 | Fujimoto et al. | 156/643 |
| 5,034,092 | 7/1991 | Lebby et al. | 156/646 |

FOREIGN PATENT DOCUMENTS

| | | |
|---|---|---|
| 0144142 | 6/1985 | European Pat. Off. |
| 0277597 | 8/1988 | European Pat. Off. |
| 43480 | 4/1978 | Japan . |
| 1-278025 | 11/1989 | Japan . |
| 1-278026 | 11/1989 | Japan . |

OTHER PUBLICATIONS

Asakawa and Sugata Oyo Buturi, vol. 54, p. 1136, 1985.
Alan Seabaugh, "Selective Reactive Ion Etching on GaAs on AlGaAs Using CCl$_2$F$_2$ and He," J. Vac. Sci. Technol. B, vol. 6, No. 1, Jan./Feb. 1988, pp. 77–81.
Hikosaka et al., "Selective Ry Etching of GIGaAs—GaAs Heterojunction," Japanese Journal of Applied Physics, vol. 20, No. 11, Nov., 1981, pp. L847–L850.
"Reactive Ion Etch Process With Highly Controllable GaAs-to-AlGaAs Selectivity Using SF$_6$ and SiCl$_4$," Appl. Phys. Lett., vol. 51, No. 14, 5 Oct. 1987, pp. 1083–1085.
Yamada et al., "Anisotropic Reactive Ion Etching Technique of GaAs and AlGaAs Materials for Integrated Optical Device Fabrication," J. Vac. Sci. Technol. B, vol. 3, No. 3, May/Jun. 1985, pp. 884–889.
Tamura et al., "GaAs and GaAlAs Reactive Ion Etching in BCl$_3$–Cl$_2$ Mixture," Japanese Journal of Applied Physics, vol. 23, No. 9, Sep. 1984, pp. L731–L733733.
Pearton et al., "Reactive Ion Etching of GaAs with CCl$_2$F$_2$LO$_2$: Etch Rates, Surfacr Chemistry and Residual Damage," J. Appl. Phys. vol. 65, No. 3, 1 Feb. 1989, pp. 1281–1292.

(List continued on next page.)

Primary Examiner—Brian E. Hearn
Assistant Examiner—George A. Goudreau
Attorney, Agent, or Firm—Cushman, Darby & Cushman

[57] ABSTRACT

A dry etching method for Al$_x$Ga$_{1-x}$N ($0 \leq x \leq 1$) semiconductor uses plasma of a boron trichloride (BCl$_3$) gas. The etching rate of the method is 490 Å/min. No crystal defect is produced in the etched semiconductor by the dry etching with the plasma of a BCl$_3$ gas. After etching with the plasma of a BCl$_3$ gas, the semiconductor is successively etched by an inert gas. The electrode formed on the etched surface is contacted ohmicly with the semiconductor. Ohmic contact can be obtained without sintering. An LED is produced by the dry etching method. The LED comprises a substrate, an n-layer (Al$_x$Ga$_{1-x}$N; $0 \leq x < 1$), an i-layer, an electrode formed on the etched surface of the n-layer through a through hole, the through hole being formed through the i-layer to the n-layer by the dry etching with the plasma of the born trichloride (BCl$_3$) gas and being successively etched by the plasma of an inert gas, and an electrode formed on the surface of said i-layer.

8 Claims, 15 Drawing Sheets

OTHER PUBLICATIONS

Smolinsky et al., "Plasma Etching of III-V Compound Semiconductor Materials and Their Oxides," J. Vac. Sci. Technol., 18(1), Jan./Feb. 1981.

Klinger et al., "Reactive Ion Etching of GaAs in $CCl_{4-x}F_x(x=0,2,4)$ and Mixed $CCl_{4-x}F_x$/Ar Discharges," J. Appl. Phys. vol. 54, No. 3, Mar. 1983, pp. 1595–1604.

Vatus et al., "Highly Selective Reactive Ion Etching Applied to the Fabrication of Low-Noise AlGaAs GaAs FET's," IEEE Transactions on Electron Devices, vol. ED-33, No. 7, Jul. 1986, pp. 934–937.

S. S. Cooperman, et al., "Reactive Ion Etching of GaAs and AlGaAs in a $BCl_3$–Ar Discharge", Journal of Vacuum Science & Technology B, Jan./Feb., 1989, pp. 41–46.

A. Scherer, et al., "Gallium Arsenide and Aluminum Gallium Arsenide Reactive Ion Etching in Boron Trichloride/Argon Mixtures", J. Vac. Sci. Technol. B 5, Nov./Dec. 1987, pp. 1599–1605.

Patent Abstracts of Japan, vol. 6, No. 100 (P-121) Jun. 1982, JP-A-57 033485 23 Feb. 1982.

Patent Abstracts of Japan, vol. 13, No. 507 (E-845) Nov. 1989, JP-A-01 204425 17 Aug. 1989.

Patent Abstracts of Japan, vol. 6, No. 42 (E-98) (920) Mar. 1982, JP-A-56 160084 09 Dec. 1981.

DRY ETCHING METHOD FOR SEMICONDUCTOR

BACKGROUND OF THE INVENTION

1. Field of the Invention;

The present invention relates to a dry etching method for an $Al_xGa_{1-x}N(0 \leq x \leq 1)$ semiconductor.

2. Description of the Related Art;

Conventionally, the $Al_xGa_{1-x}N(0 \leq x \leq 1)$ semiconductor has been watched with keen interest as a material for a light emitting diode emitting a blue light and a light emitting device emitting a light with a short wavelength, and in manufacturing such a device, it is required to establish etching techniques such as mesa etching, recess etching and the like likewise the case of other compound semiconductors.

The $Al_xGa_{1-x}N$ semiconductor is a substance which is very stable chemically, and is insoluble in an acid such as hydrochloric acid, sulfuric acid, or hydrofluoric acid or a mixture thereof which is used normally as an etching fluid for other III-V group compound semiconductors. For this reason, a wet etching method using such fluids can not be applied to etching for the $Al_xGa_{1-x}N$ semiconductor.

The present inventors developed a dry etching method for the $Al_xGa_{1-x}N(0 \leq x \leq 1)$ semiconductor with the plasma gas of carbon tetrachloride ($CCl_4$) or dichlorodifluoromethane ($CCl_2F_2$). (See Japanese Laid-Open Patent Publication Nos. 278025/1989 and 278026/1989, and U.S. Pat. No. 4,946,548.)

However, the carbon tetrachloride ($CCl_4$) and the dichlorodifluoromethane ($CCl_2F_2$) are designated as the substances destroying the ozone layer and are to be completely forbidden to be used by A.D. 2000. Also, the problem is reported that since polymers comprising carbon are formed on the etched surface of the semiconductor in the plasma etching with the gas comprising carbon, the etched surface is lowered in quality.

Predicting a gas having a desirable reaction characteristic in the plasma etching is impossible because the reaction mechanism is affected by the combination and the crystalline structure of atoms of a compound semiconductor to be etched. Accordingly, prediction cannot be made on whether or not an existing reaction gas is effective for etching the $Al_xGa_{1-x}N$ semiconductor.

A gas effective for etching the $Al_xGa_{1-x}N$ semiconductor is not reported except for the disclosure by the present inventors.

SUMMARY OF THE INVENTION

Accordingly, an object of the present invention is to provide a dry etching method for the $Al_xGa_{1-x}N$ semiconductor.

Another object of the present invention is to facilitate manufacture of a light emitting diode emitting a blue light by establishing the dry etching method for the $Al_xGa_{1-x}N$ semiconductor.

Also, a further object of the present invention is to make a precise ohmic contact on an etched surface.

Then the present inventors have zealously carried out experimental studies on the etching rate, the kind of reaction gases to be used and other conditions in plasma etching of the $Al_xGa_{1-x}N$ semiconductor, and have found the following facts as a result.

Boron trichloride ($BCl_3$) is the most suitable etching gas in the plasma etching for the $Al_xGa_{1-x}N$ semiconductor. No crystal defect is produced in the semiconductor by the plasma etching. And also, a precise ohmic contact can be formed on an etched surface without sintering by successively etching the etched surface of $Al_xGa_{1-x}N$ with the plasma of an inert gas after etching $Al_xGa_{1-x}N$ with the plasma of the boron trichloride ($BCl_3$) gas. The present invention is completed based upon the facts.

According to one aspect of the invention, there is provided a method comprising the steps of: introducing a boron trichloride ($BCl_3$) etching gas into a reaction chamber under vacuum; applying high-frequency power to produce the plasma of the boron trichloride ($BCl_3$) gas; and etching the $Al_xGa_{1-x}N$ ($0 \leq x \leq 1$) semiconductor with the plasma.

Here, the flow rate of the etching gas is preferably 2-30 cc/min., the degree of vacuum is preferably 0.02-0.2 Torr and the high-frequency power density is preferably 0.1-0.5 W/cm$^2$.

According to another aspect of the invention, there is provided a method further comprising the steps of: introducing an inert gas into the reaction chamber under vacuum after etching with the plasma of a $BCl_3$ gas; applying high-frequency power to produce the plasma of the inert gas; and successively etching an etched surface of the $Al_xGa_{1-x}N$ ($0 \leq x \leq 1$) semiconductor with the plasma of the inert gas after etching the $Al_xGa_{1-x}N$ ($0 \leq x \leq 1$) semiconductor with the plasma of the boron trichloride ($BCl_3$) gas.

Here, the flow rate of the inert gas is preferably 2-30 cc/min., the degree of vacuum is preferably 0.02-0.2 Torr, the high-frequency power density is preferably 0.1-0.5 W/cm$^2$, the inert gas is preferably Ar, He, Ne, Kr, Xe, or Rn, and the etching time is preferably 2-15 minutes.

According to another aspect of the invention, there is provided a method further comprising the step of: forming an electrode on the surface of the $Al_xGa_{1-x}N$ ($0 \leq x \leq 1$) semiconductor etched by the plasma of the inert gas. Here, the electrode is preferably of aluminum.

According to another aspect of the invention, there is provided a light emitting diode comprising: a substrate; an n-layer of n-type gallium nitride compound semiconductor ($Al_xGa_{1-x}N$; $0 \leq x < 1$); an i-layer of insulating gallium nitride compound semiconductor ($Al_xGa_{1-x}N$; $0 \leq x < 1$) doped with p-type impurities; an electrode formed on an etched surface of the n-layer through a through hole; the through hole being formed through the i-layer to the n-layer by etching with the plasma of a boron trichloride ($BCl_3$) gas and the through hole being successively etched by the plasma of inert gas; and an electrode formed on the surface of the i-layer.

The above-mentioned plasma etching is performed normally by employing: a parallel-electrode-type apparatus wherein electrodes whereto high-frequency power is applied are disposed in parallel and objects to be etched are disposed on the electrode; a cylindrical-electrode-type apparatus wherein electrodes whereto high-frequency power is applied are disposed cylindrically and objects to be etched are disposed in parallel to the cross-section of the cylinder; or an apparatus of other configuration. Also, the plasma state of a boron trichloride ($BCl_3$) gas is generated by applying high-frequency power between the electrodes in the above-mentioned parallel-electrode-type apparatus or cylindrical-electrode-type apparatus.

DESCRIPTION OF THE INVENTION

Hereinafter, description is made on the present invention based on a specific embodiment.

EXAMPLE 1

Figure 2:
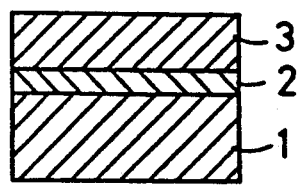
FIG. 2 is a cross-sectional view showing a configuration of a sample to be etched.

Semiconductors used in a method of this embodiment were fabricated in a structures as shown in FIG. 2 by the metalorganic vapor phase epitaxy method (hereinafter referred to as MOVPE)

Gases used in this method are $NH_3$ and carrier gas $H_2$ and trimethylgallium ($Ga(CH_3)_3$) (hereinafter referred to as "TMG") and trimethylaluminum ($Al(CH_3)_3$) (hereinafter referred to as "TMA").

First, a single crystal sapphire substrate 1 whose main plane is the c-surface ({0001}) cleaned by organic cleaning and heat treatment was attached to a susceptor placed in a reaction chamber of a MOVPE apparatus. Next, the pressure in the reaction chamber was reduced to 5 Torr, and the sapphire substrate 1 was vaporetched at a temperature of 1100° C. with a $H_2$ gas flowing into the reaction chamber at a flow rate of 300 cc/min.

Subsequently, the temperature was reduced to 400° C., and heat treatment was executed while $H_2$ was supplied at a flow rate of 3000 cc/min., $NH_3$ at a flow rate of 2000 cc/min., and TMA at a flow rate of $7 \times 10^{-6}$ mol/min. An AlN buffer layer 2 was formed in the thickness of about 500 Å by this heat treatment.

Next, the supply of TMA was stopped, and the temperature of the sapphire substrate 1 was kept at 1150° C., and $H_2$ was supplied at a rate of 2500 cc/min., $NH_3$ at a rate of 1500 cc/min. and TMG at a rate of $1.7 \times 10^{-5}$ mol/min., and thereby a GaN layer 3 of about 3 μm in film thickness was formed.

Figure 3:
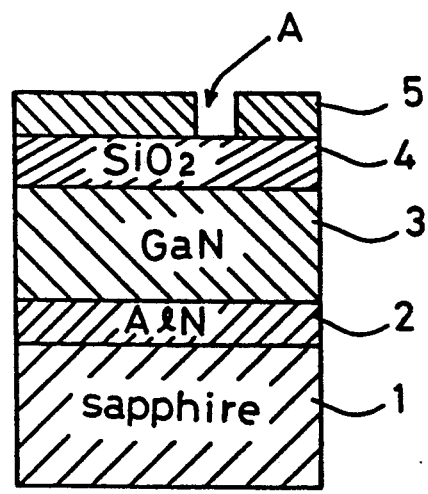
FIG. 3 and FIG. 4 are cross-sectional views showing a relationship between the sample to be etched and a mask.

Next, a $SiO_2$ layer 4 of 5000 Å in thickness was formed on the top surface of the GaN layer 3 by high-frequency sputtering as shown in FIG. 3. Next, a photoresist 5 was uniformly spreaded on the $SiO_2$ layer 4 and a window portion A was removed from the photoresist 5 by photolithography.

Figure 4:
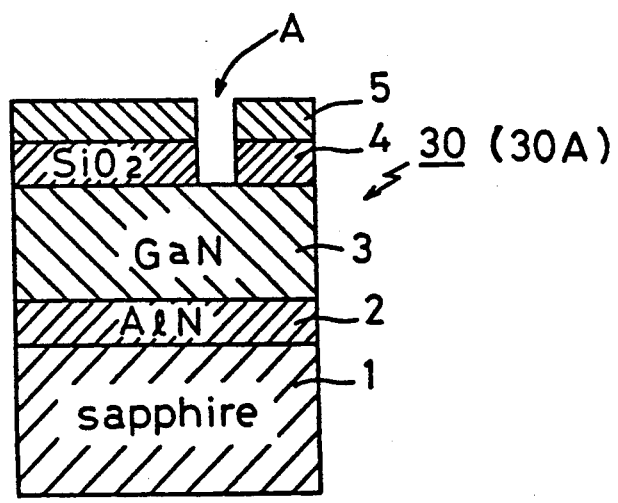

Next, as shown in FIG. 4, the portion of the $SiO_2$ layer 4 which was not covered with the photoresist 5 was removed by etching with an acid of hydrofluoric acid group. Thereby, a double mask layer consisting of the $SiO_2$ layer 4 and the photoresist 5 was formed with the window A corresponding to the etched portion of the GaN layer 3.

Figure 1:
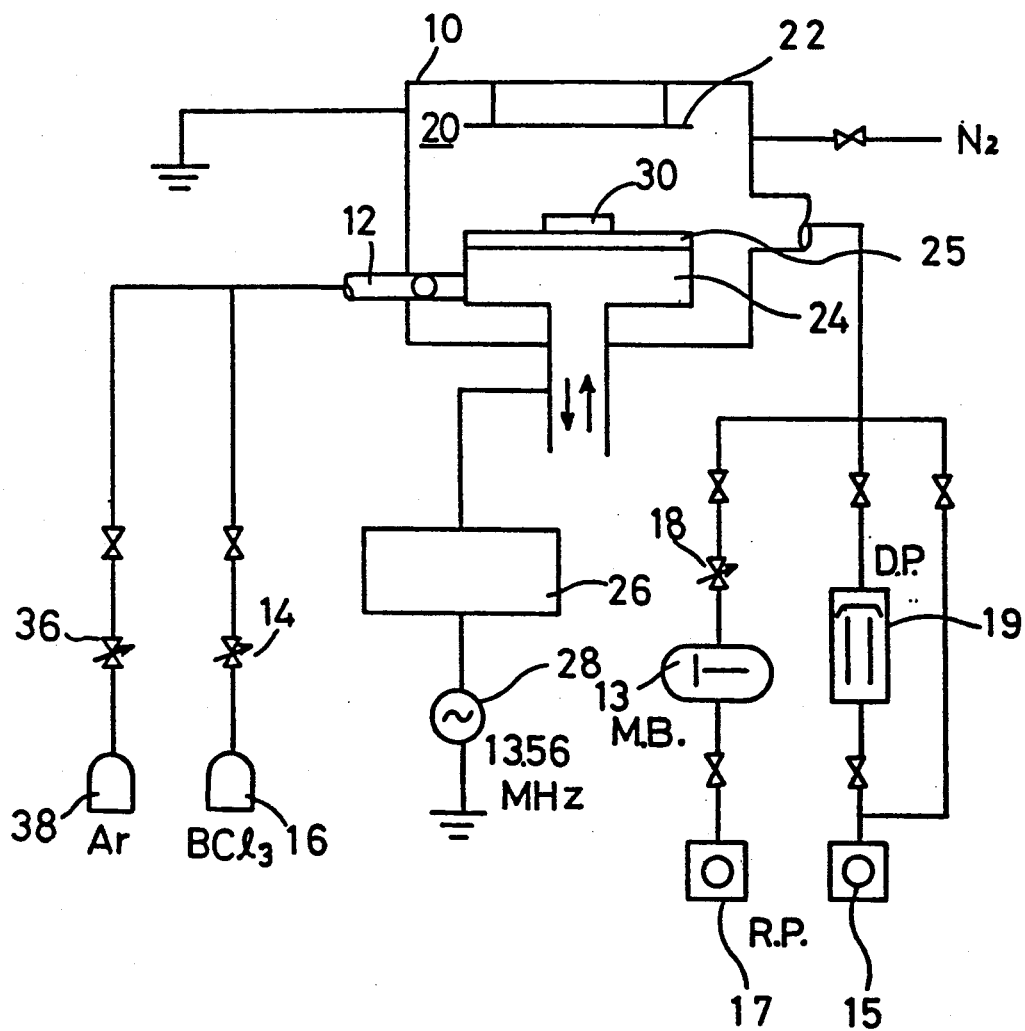
FIG. 1 is a configuration view showing an apparatus for realizing an etching method of one specific embodiment in accordance with the present invention.

Next, the sample 30 as shown in FIG. 4 was placed in a plasma etching apparatus with parallel flat plate electrodes as shown in FIG. 1 in order to etch the exposed portion of the GaN layer 3.

In the parallel-electrode-type apparatus in FIG. 1, an introducing tube 12 introducing an etching gas is installed on the side wall of a stainless steel vacuum vessel 10 forming a reaction chamber 20, and the introducing tube 12 is connected to a tank 16 storing a boron trichloride ($BCl_3$) gas through a mass flow controller 14 capable of varying the gas flow rate. Then, a $BCl_3$ gas is introduced into the reaction chamber 20 from the tank 16 through the mass flow controller 14.

Also, the introducing tube 12 is connected to a tank 38 storing an argon (Ar) gas through a mass flow controller 36 capable of varying the gas flow rate. Then, an Ar gas is introduced into the reaction chamber 20 from the tank 38 through the mass flow controller 36.

And also, the reaction chamber 20 is exhausted by rotary pumps 15 and 17, a diffusion pump 19 and a mechanical booster pump 13, and the degree of vacuum of the reaction chamber 20 is adjusted by a valve 18.

On the other hand, an electrode 22 and an electrode 24 which are insulated from the vacuum vessel 10 are disposed in the reaction chamber 20 with facing each other in the up-down direction. Then, the electrode 22 is grounded, and the electrode 24 is supplied with high-frequency power. The high-frequency power is supplied from a high-frequency power source 28 with a frequency of 13.56 MHz through a matching unit 26.

Also, a sample is put on the quartz plate 25 which is disposed on the electrode 24.

Plasma etching was performed in the apparatus having such a configuration as follows. The sample 30 was put on the quartz plate 25, and thereafter a residual gas in the reaction chamber 20 was fully exhausted by the diffusion pump 19, and the degree of vacuum of the reaction chamber 20 was reduced to about $5 \times 10^{-6}$ Torr. Thereafter, a $BCl_3$ gas was introduced into the reaction chamber 20 from the side where the electrode 24 was equipped at a flow rate of 10 cc/min. by the mass flow controller 14, and the degree of vacuum of the reaction chamber 20 was adjusted accurately to 0.04

Torr by the valve 18. Then, when high-frequency power of 800 W (power density 0.44 W/cm$^2$) was supplied, glow discharge was started between the electrodes 24 and 22, and the introduced BCl$_3$ gas was put in the plasma state, and etching of the sample 30 was started.

Figure 5:
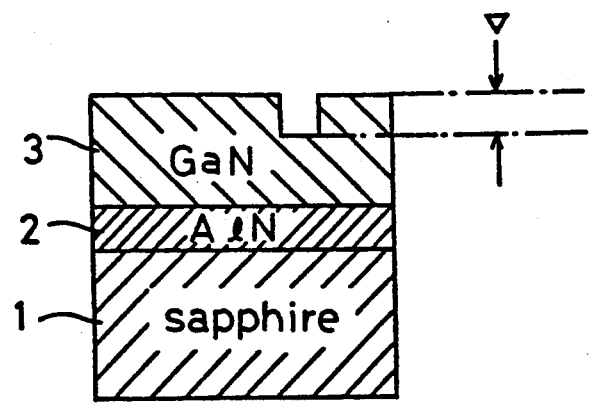
FIG. 5 is a cross-sectional view of the sample after etching.

After etching for a predetermined time, the sample 30 was pulled out from the reaction chamber 20 and the SiO$_2$ layer 4 was etched to be removed by hydrofluoric acid. As a result, the sample 30 with a structure as shown in FIG. 5 was got. The portion of the GaN layer 3 covered with the SiO$_2$ layer 4 was not etched, and only the exposed portion of the GaN layer 3 was etched in a shape as illustrated in FIG. 5. An etching depth was measured with a step difference meter.

Figure 6:
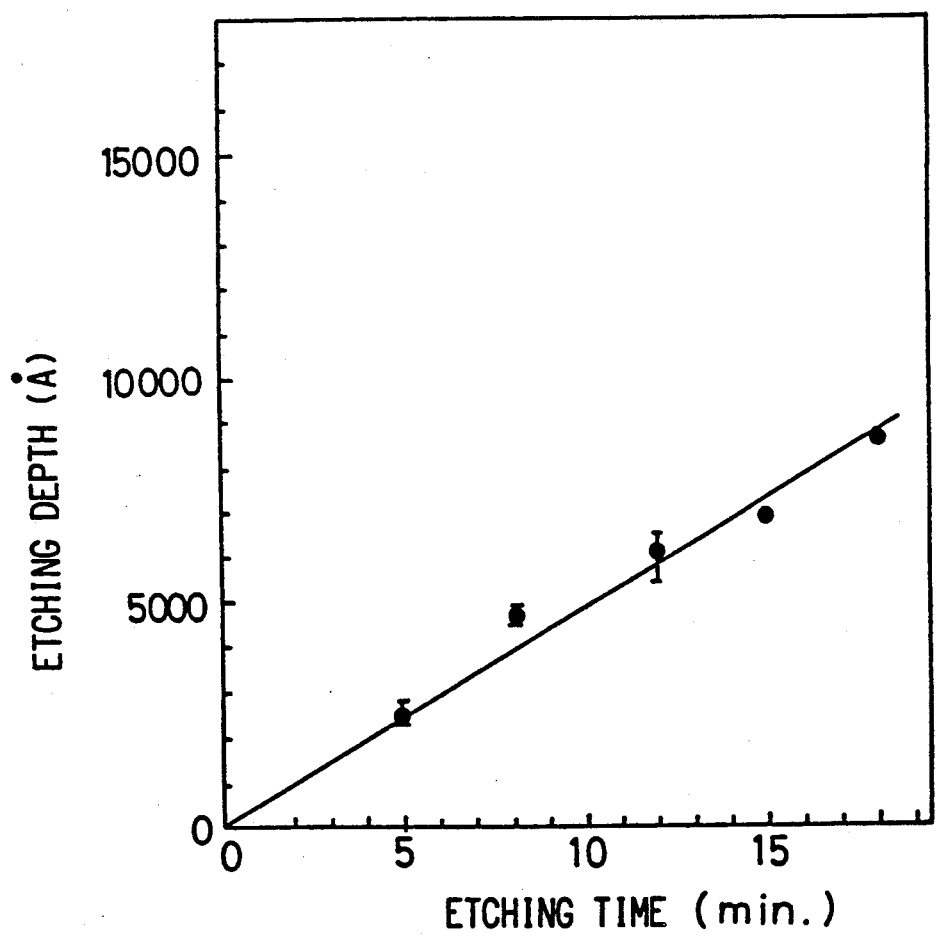
FIG. 6 is a graph showing measured values of etching rate.

The etching above mentioned was repeated at different etching time, and the etching depths produced by the etching were measured with the step difference meter, and the relationship between the etching depth and the etching time was measured. FIG. 6 shows the result thereof. From the result of the measurement, the etching rate was 490 Å/min.

Figure 7A:
FIG. 7A is a microphotograph showing the morphology of a surface etched by plasma of a $BCl_3$ gas.
Figure 7B:
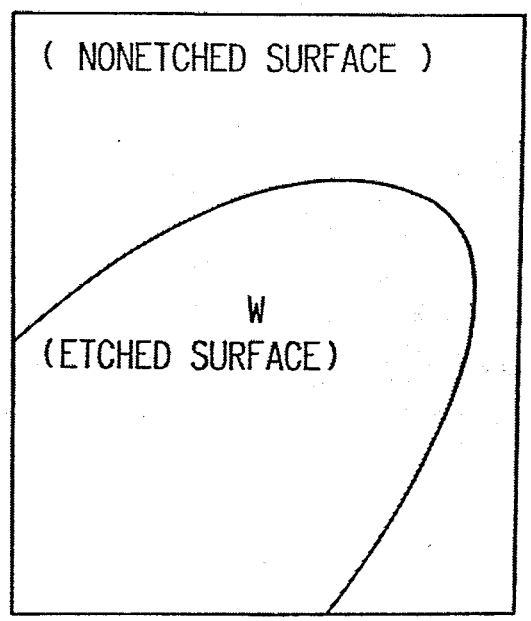
FIG. 7B is an illustration indicating etched and nonetched regions in FIG. 7A.

Images showing morphology of the various etched surfaces were taken with a scanning electron microscope (hereafter the image is referred to as a SEM image). One of the SEM images whose magnification is 5000 is shown in FIG. 7A. The etched surface in FIG. 7A is the portion corresponding to the region W in FIG. 7B. As is apparent from the SEM image, the etched surface is very uniform and flat, and foreign substances are not heaped on the surface.

Figure 8A:
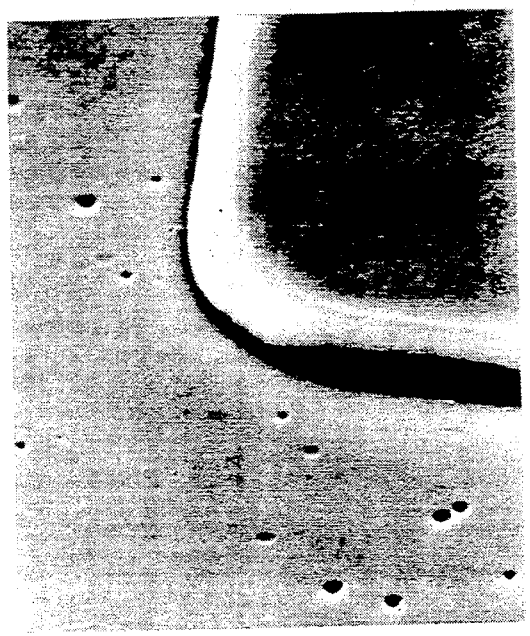
FIG. 8A is a microphotograph showing the morphology of a surface etched by plasma of a $CCl_2F_2$ gas.
Figure 8B:
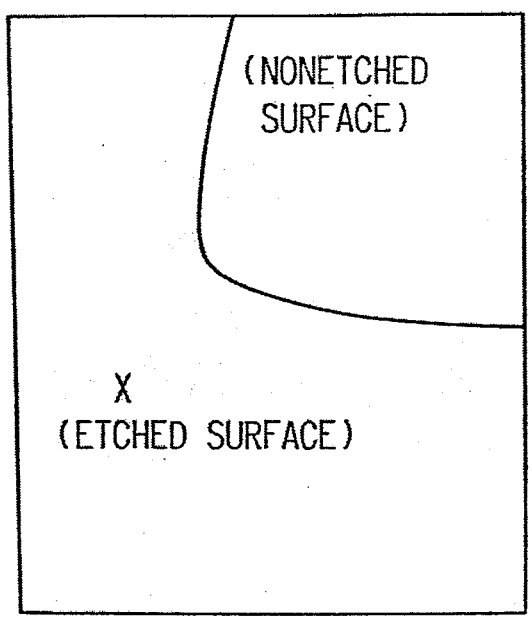
FIG. 8B is an illustration indicating etched and nonetched regions in FIG. 8A.
Figure 9A:
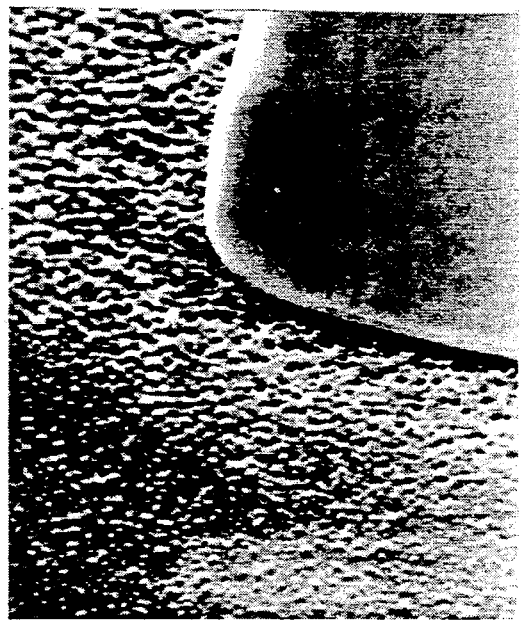
FIG. 9A is a microphotograph showing the morphology of a surface etched by plasma of a $CCl_2F_2$ gas.
Figure 9B:
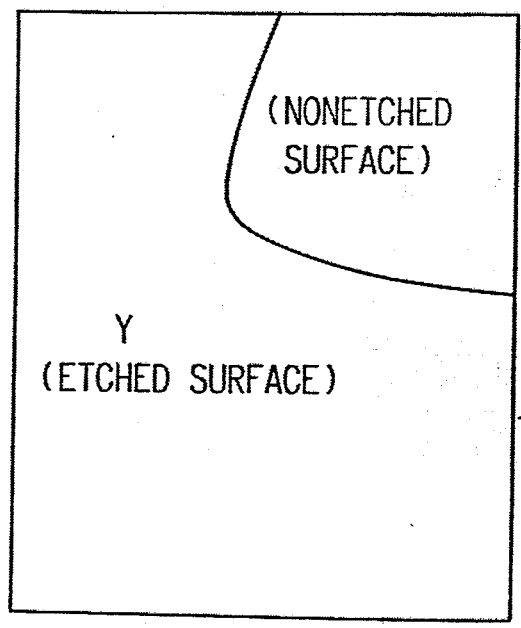
FIG. 9B is an illustration indicating etched and nonetched regions in FIG. 9A.

For the purpose of comparison, many times of etching were performed under similar conditions by changing the etching gas to CCl$_2$F$_2$, and the SEM images of the etched surfaces of the GaN layers 3 were measured. Typical ones of the SEM images are shown in FIGS. 8A and 9A. The etched surfaces in FIGS. 8A and 9A are the portions corresponding to the regions X and Y in FIGS. 8B and 9B, respectively. As is apparent from FIG. 8A, many concavities exist on the etched surface. Also, as is apparent from in FIG. 9A, polymers comprising carbon are formed on the etched surface and the etched surface is not flat on account of the polymers.

Figure 10:
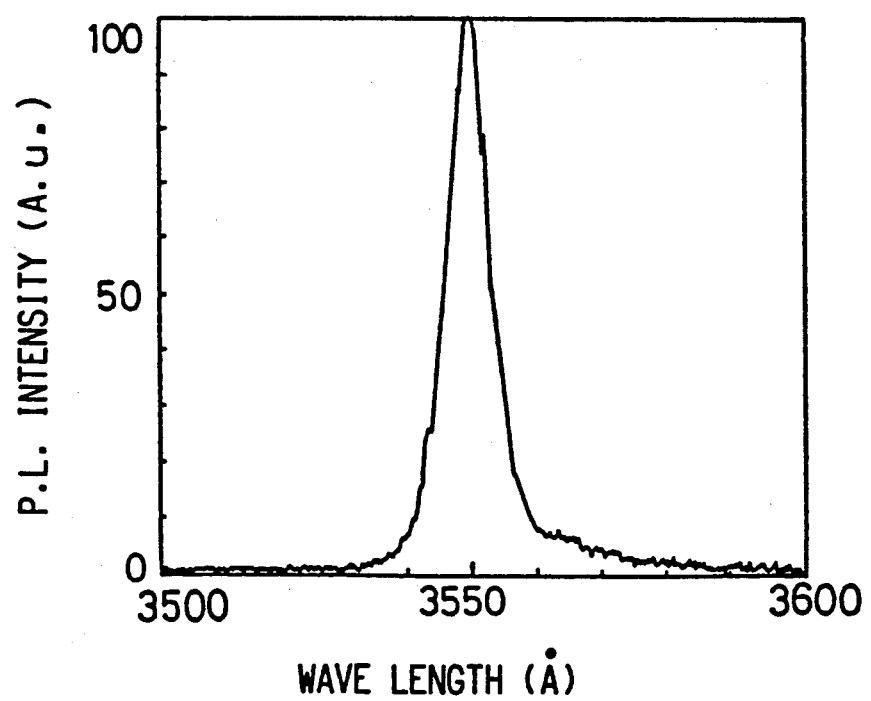
FIG. 10 is a graph showing a photoluminescence spectrum of GaN before etching.
Figure 11:
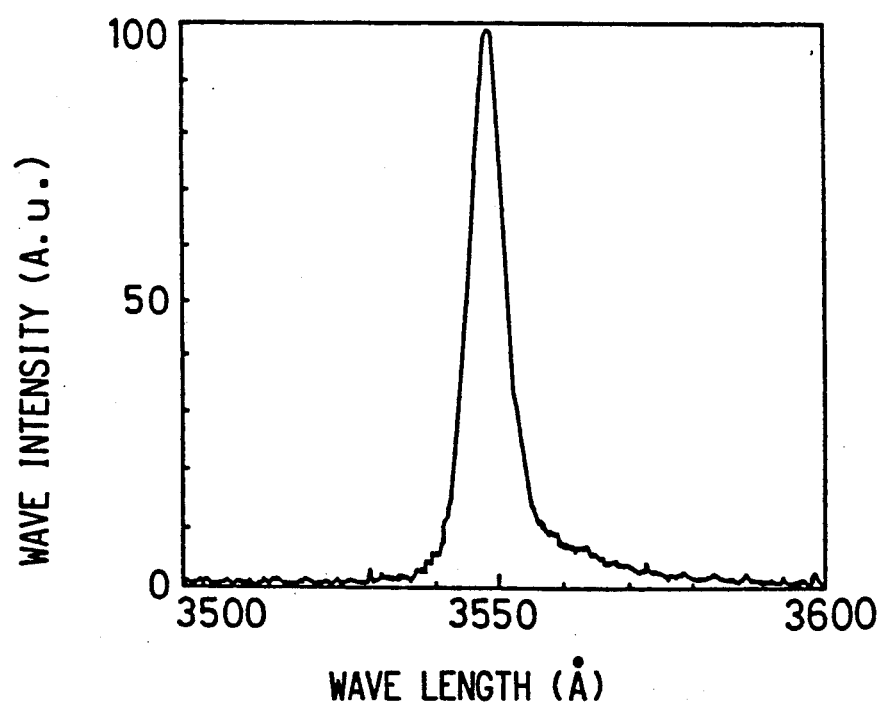
FIG. 11 is a graph showing a photo luminescence spectrum of GaN after etching with plasma of a boron trichloride ($BCl_3$) gas.

Also, the samples were cooled to 4.2 K before and after the above-mentioned etching with BCl$_3$, and the intensity of photoluminescence was measured by irradiating a helium cadmium laser with a wavelength of 3250 Å. FIGS. 10 and 11 show the result thereof. FIG. 10 shows a photoluminescence spectrum before etching, and FIG. 11 shows a photoluminescence spectrum after etching. No change was found in the peak intensity, the peak wavelength and the half value width in the photoluminescence spectra. It was recognized from these facts that the crystalline property of the GaN layer 3 is not changed by above-mentioned etching.

Also, from the fact that the AlN underlayer 2 was etched by sufficient treatment with BCl$_3$, it was found that the method of this invention is applicable also to the etching of the general semiconductors with the formula Al$_x$Ga$_{1-x}$N.

EXAMPLE 2

Another sample 30A was made in the construction as shown in FIG. 4 by a method as in the example 1. After the sample 30A was disposed on the electrode 25 in the reaction chamber 20, the sample 30A was etched by the plasma of a BCl$_3$ gas for 8 minutes as in the example 1. After the etching, the supply of a BCl$_3$ gas and the high-frequency power was stopped and an argon (Ar) gas was introduced into the reaction chamber 20 through the introducing tube 12. The flow rate of the Ar gas was controlled at 10 cc/min. by the mass flow controller 36, and the degree of vacuum of the reaction chamber 20 was adjusted accurately to 0.04 Torr by the valve 18. Then, when high-frequency power of 800 W (power density 0.44 W/cm$_2$) was supplied, glow discharge was started between the electrodes 25 and 22, and the plasma of an Ar gas was generated.

In such a way, the surface of the sample 30A was successively etched for 5 minutes after the plasma etching with BCl$_3$. After etching with the plasma of an Ar gas, the sample 30A was pulled out from the reaction chamber 20 and the SiO$_2$ layer 4 was etched to be removed by hydrofluoric acid. As a result, the sample 30A with the structure as shown in FIG. 5 was got. Next the sample 30A was cleaned for 10 minutes with acetone, trichloroethylene and acetone in this sequence, respectively, and was dried by blowing of a nitrogen gas.

Figure 12:
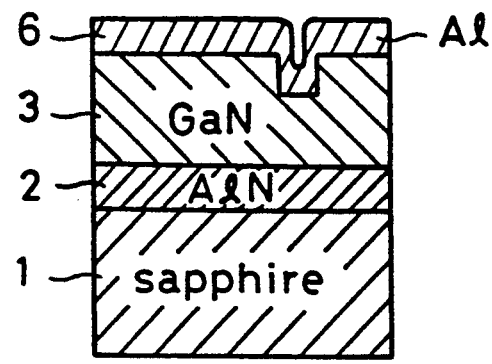
FIG. 12 to FIG. 14 are sectional views illustrating processes for producing electrodes using a dry etching method according to another embodiment.
Figure 13:
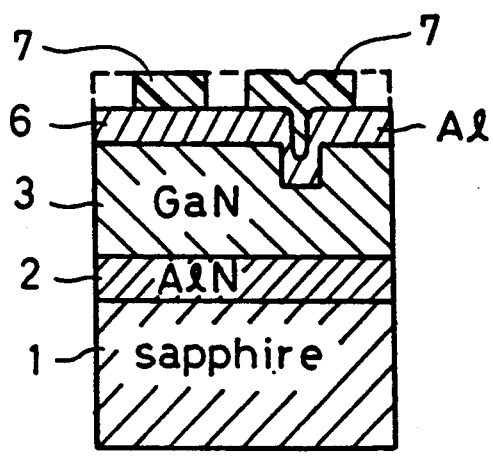

Next, the sample 30A was heated at 225° C. and aluminum layer 6 were uniformly deposited on the surface of the GaN layer 3 of the sample 30 at the degree of vacuum of 3×10$_{-6}$ Torr as shown in FIG. 12. Next, a photoresist 7 was spreaded on the aluminum 6 and unnecessary portions of the photoresist 7, i. e., the portions for electrodes to be formed on, removed by photolithography as shown in FIG. 13. The portions of the aluminum 6 which were not covered with the photoresist 7 were etched by nitric acid. As a result, the electrodes 71 and 72 were formed on the etched surface and nonetched surface of the sample 31A, respectively, as shown in FIG. 14.

Figure 15:
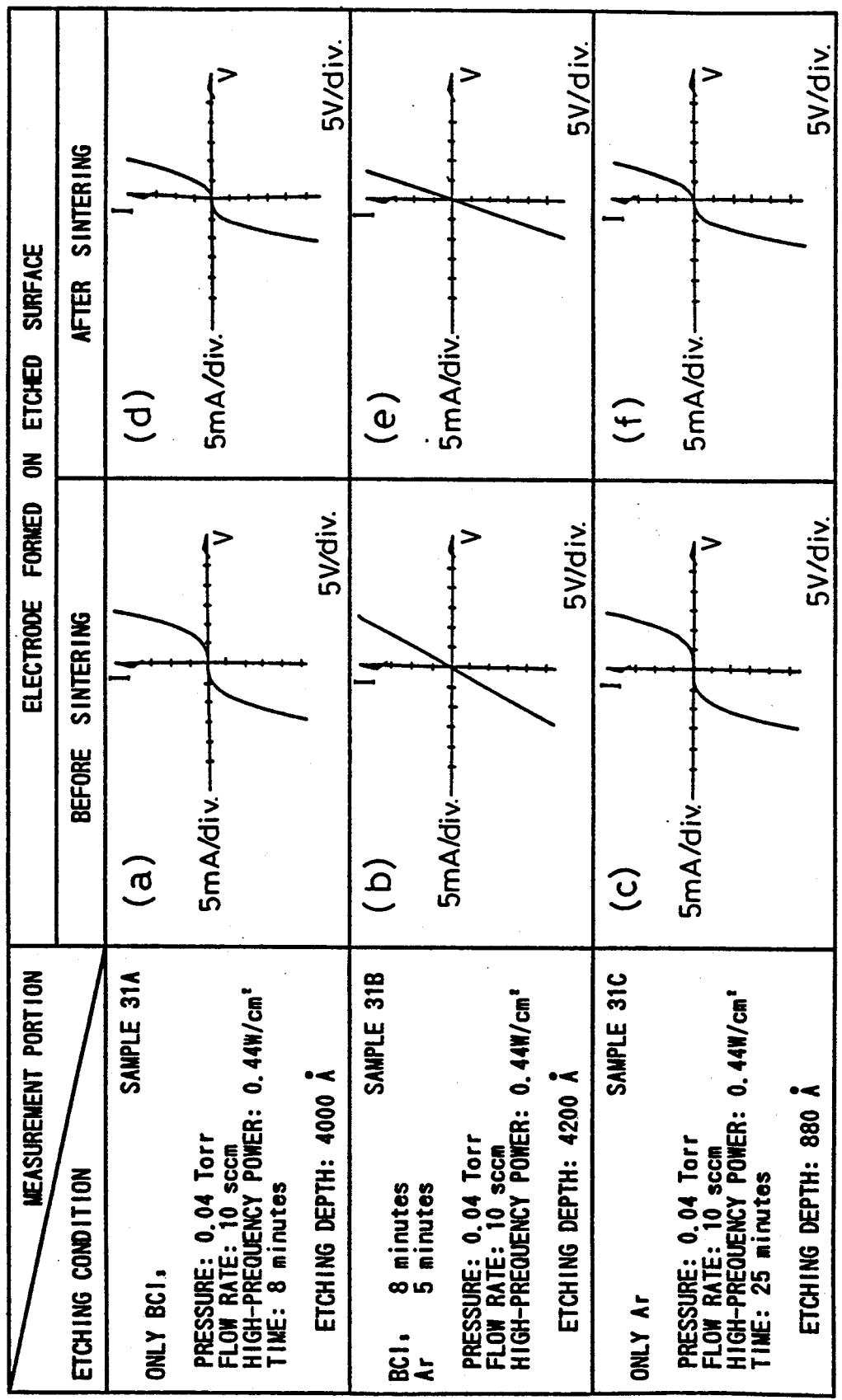
FIG. 15 is a graph showing measured V-I characteristics of electrodes formed on various etched surfaces.

Voltage-current characteristic (hereafter referred to as V-I characteristic) of the electrode 72 formed on the etched surface was measured. The V-I characteristic is shown in the region (b) of FIG. 15. As is apparent from the region (b) of FIG. 15, the electrode 72 shows a precise ohmic contact, because the V-I characteristic curve is linear.

Next, the V-I characteristic was measured with respect to the sample 31A which was sintered. The V-I characteristic is shown in the region (e) of FIG. 15. It is found that the V-I characteristic curve is linear.

Figure 14:
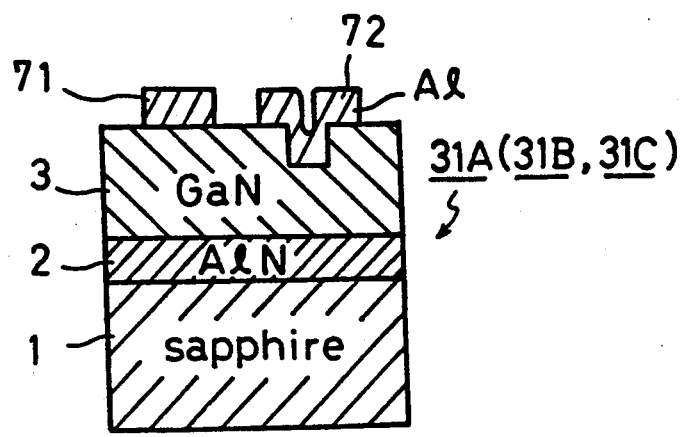

For the comparison, other samples 31B and 31C as shown in FIG. 14 were made as described above. One of the samples 31B was etched by only the plasma of a BCl$_3$ gas without successively etching with an Ar gas.

V-I characteristic was measured with respect to the electrode which was deposited in the etched surface. The V-I characteristic is shown in the region (a) of FIG. 15. As is apparent from the region (a) of FIG. 15, ohmic contact is not obtained, because the V-I characteristic curve is not linear. Next, after the sample 31B was sintered for 10 minutes a 500°C., the V-I characteristic of the sample 31B was measured. The V-I characteristic is shown in the region (d) of FIG. 15. As is apparent from the region (d) of FIG. 15, ohmic contact can not be got even after sintering, because the V-I characteristic curve in not linear.

The other sample 31C was etched using only the plasma of an Ar gas without etching with BCl$_3$. V-I characteristic of the sample was measured. The V-I characteristic is shown in the region (c) of FIG. 15. As is apparent from the region (c) of FIG. 15, ohmic contact is not realized, because the V-I characteristic curve is not linear. Next, after the sample 31C was sintered, V-I characteristic of the sample 31C was measured. The V-I characteristic is shown in the region (f) of FIG. 15. As is apparent from the region (f) of FIG. 15, ohmic contact can not be got even after sintering, because the V-I characteristic curve is not linear.

Figure 16:
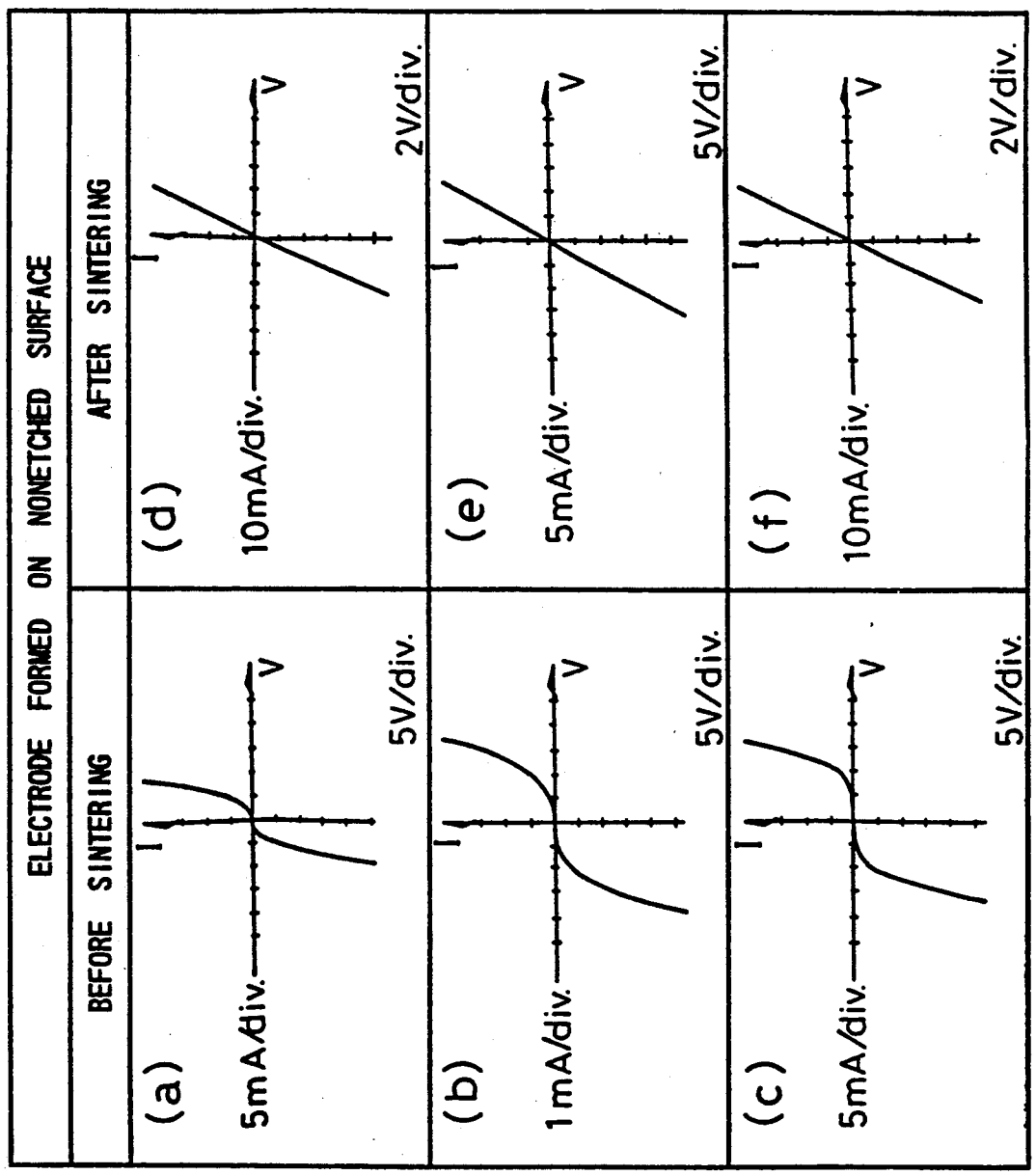
FIG. 16 is a graph showing measured V-I characteristics of electrodes formed on nonetched surfaces of the samples used in measurements of FIG. 15.

With respect to the samples 31A, 31B and 31C, the V-I characteristics of the electrode 71 formed on a nonetched surface were measured. The characteristics are shown in the regions (a), (b) and (c) of FIG. 16, respectively. As is apparent from FIG. 16, ohmic contacts are not got with respect to all of the samples 31A, 31B and 31C.

Next, the V-I characteristics were measured with respect to the samples 31A, 31B and 31C which were sintered. The V-I characteristics are shown in the regions (d), (e) and (f) of FIG. 16. As is apparent from FIG. 16, ohmic contacts are realized by sintering, because the characteristic curves are linear.

From the facts described above, it was found that the electrode formed on the surface etched by only the plasma of $BCl_3$ is not ohmic contact and the ohmic contact is not got even after sintering.

It was found, however, that the electrode formed on the surface successively etched by the plasma of an Ar gas after etching with the plasma of a $BCl_3$ gas is ohmic contact without sintering.

According to the consideration of the present inventors, an energy barrier seems to be formed on the surface etched by the $BCl_3$ plasma on account of $BCl_3$ molecule and reaction products absorbed on the surface. The energy barrier, however, seems to be removed by etching with an Ar plasma. Accordingly, all other inert gases which can be remove the barrier by etching are available for getting ohmic contact.

EXAMPLE 3 light emitting diode was produced by the present dry etching method. The production method is described as follows.

Figure 17:
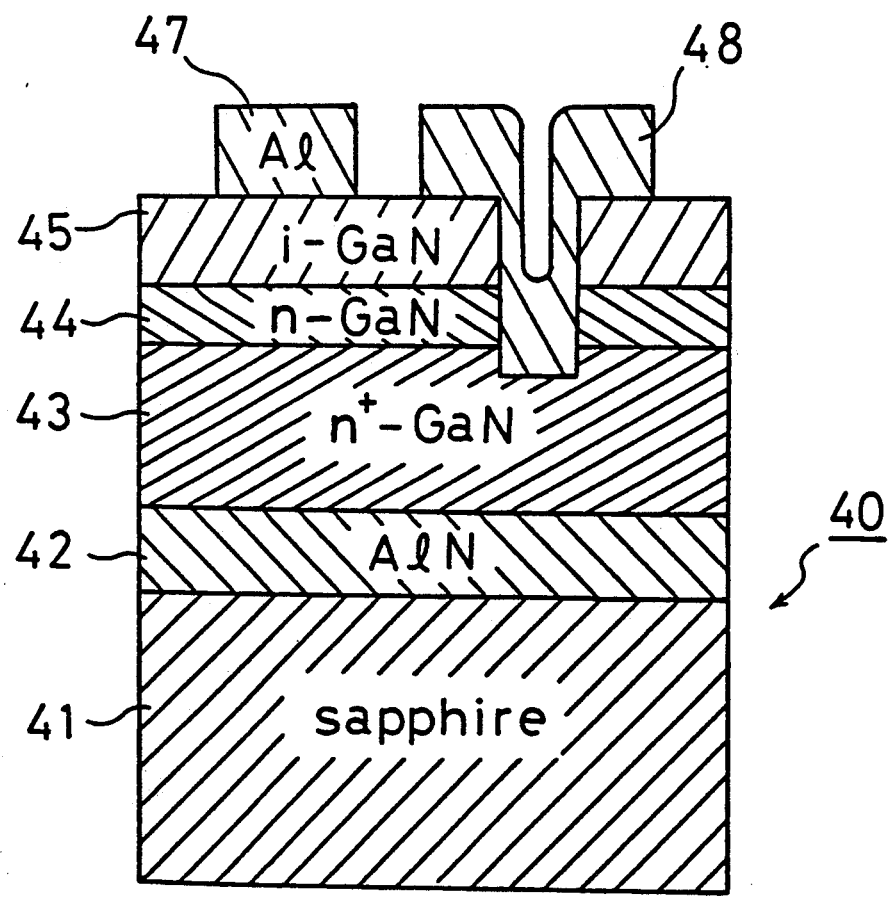
FIG. 17 is a sectional view illustrating a light emitting diode according to another preferred embodiment of the present invention.

The dry etching method according to the present invention is applied to producing electrodes in the light emitting diode with construction in FIG. 17.

In FIG. 17 there is shown a light emitting diode 40 which has a sapphire substrate 41 on which is formed a buffer layer 42 of 500 Å thick AlN. On the buffer layer 42 are consecutively formed an n+-layer 43 of a high carrier concentration of 4.5 μm thick GaN and an n-layer 44 of low carrier concentration of 1.5 μm thick GaN. And an i-(insulating) layer 45 of 0.25 μm thick GaN doped with zinc (Zn) is formed on the n-layer 44. Aluminum electrodes 47 and 48 are connected to the i-layer 45 and the N+-layer 43, respectively.

The production method for the light emitting diode with this structure is described as follows.

This light emitting diode 40 was produced by the MOVPE in the following manner.

The gases employed in this process are $NH_3$, $H_2$ (as carrier gases), trimethyl gallium ($Ga(CH_3)_3$) (TMG), trimethyl aluminum ($Al(CH_3)_3$) (TMA), silane ($SiH_4$), and diethyl zinc (DEZ hereinafter).

The sapphire substrate 41 of single crystal, with c-surface {0001} as its principal crystal plane cleaned by solvent washing and heat treatment, was set on the susceptor placed in a reaction chamber of an MOVPE apparatus.

The sapphire substrate 41 underwent vapor phase etching at 1100° C. with $H_2$ flowing through the reaction chamber at a flow rate of 2000 cc/min under normal pressure.

On the sapphire substrate 41 was formed the AlN buffer layer 42 (about 500 Å thick) at 400° C. by supplying $H_2$ at a flow rate of 20,000 cc/min, $NH_3$ at a flow rate of 10,000 cc/min, and TMA at a flow rate of $1.8 \times 10^5$ mol/min.

On the buffer layer 42 was formed the n+-layer 43 of high carrier concentration ($1.5 \times 10^{18}/cm^3$) of 2.2 μm thick GaN by supplying $H_2$ at a flow rate of 20,000 cc.min, $NH_3$ at a flow rate of 10,000 cc/min, TMG at a flow rate of $1.7 \times 10^{-4}$ mol/min, and silane (diluted to 0.86 ppm with $H_2$) at a flow rate of 200 cc/min, with the sapphire substrate 41 kept at 1150° C.

On the n+-layer 43 was formed the n-layer 44 of low carrier concentration ($1 \times 10^{15}/cm^3$) of 1.5 μm thick GaN by supplying $H_2$ at a flow rate of 20,000 cc/min, $NH_3$ at a flow rate of 10,000 cc/min, and TMG at a flow rate of $1.7 \times 10^{-4}$ mol/min, with the sapphire substrate 41 kept at 1150° C.

On the n-layer 44 was formed the i-layer 45 of 0.2 μm thick GaN with zinc by supplying $H_2$ at a flow rate of 20,000 cc/min, $NH_3$ at a flow rate of 10,000 cc/min, TMG at a flow rate of $1.7 \times 10^{-4}$ mol/min, and DEZ at a flow rate of $1.5 \times 10^{-4}$ mol/min, with the sapphire substrate 41 kept at 10,000° C.

Figure 18:
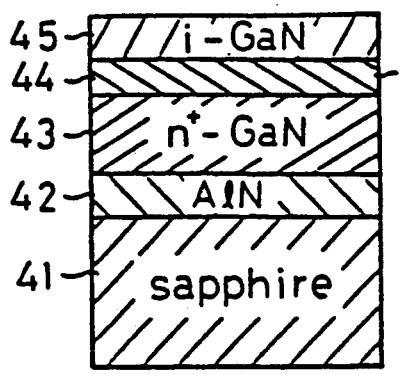
FIGS. 18 to 24 are sectional views illustrating processes for producing a light emitting diode shown in FIG. 17.

Thus there was obtained the multi-layer structure as shown in FIG. 18.

Figure 19:
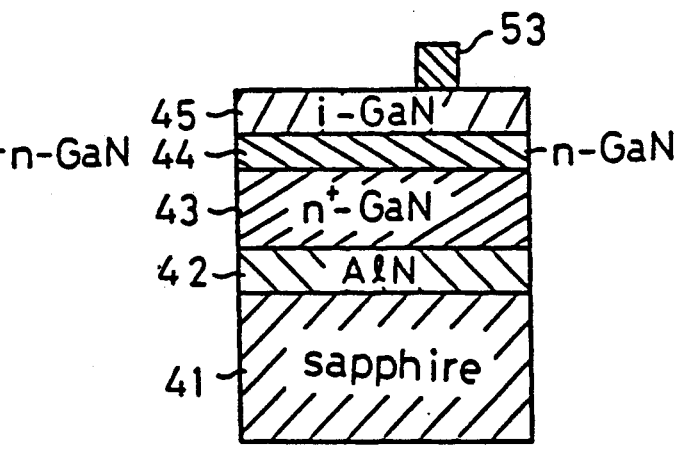

After photoresist was spreaded on the i-layer 45, the photoresist layer 53 with a predetermined pattern was formed by photolithography so as for the photoresist of the etched portion (window) to remain as shown in FIG. 19.

Figure 20:
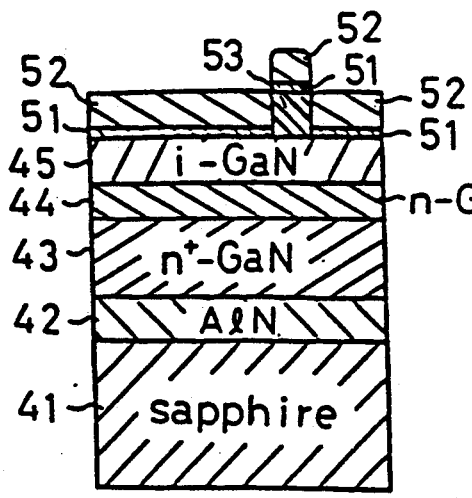
Figure 21:
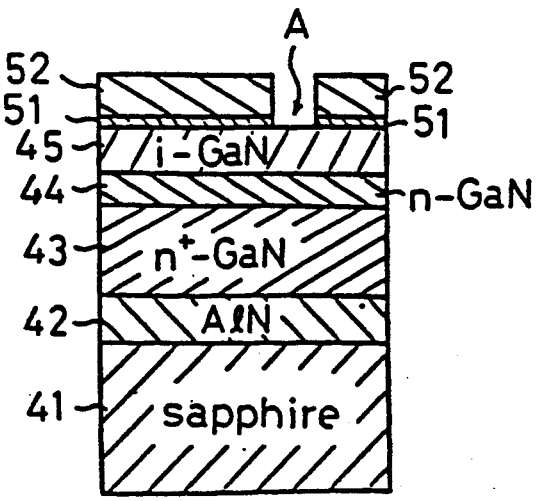

On the i-layer 45 and the photoresist layer 53 was uniformly formed a 100 Å thick $SiO_2$ layer 51 by sputtering at a pressure of $5 \times 10^{-3}$ Torr, a high-frequency power of 300 W and a growth rate of 27 Å/min., as shown in FIG. 20. Subsequently, a 2500 Å thick $Al_2O_3$ layer 52 was formed on the $SiO_2$ layer 51 by sputtering at a pressure of $5 \times 10^{-3}$ Torr, a high-frequency power of 300 W and a growth rate of 26 Å/min.

Next, the sample shown in FIG. 20 was dipped in a solvent for photoresist, e.g., acetone, to remove the portion of $SiO_2$ layer 51 and $Al_2O_3$ layer 52 right on the photoresist 53 together with the photoresist 53. Thereby the window A was formed through the $SiO_2$ layer 51 and $Al_2O_3$ layer 52.

Figure 22:
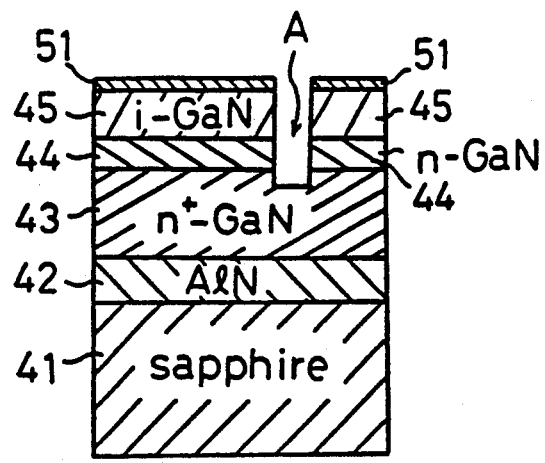

The exposed part (the window A) of the i-layer 45, which was not covered with the $SiO_2$ layer 51 and $Al_2O_3$ layer 52, was etched for 40 minutes by the plasma of a $BCl_3$ gas at a flow rate of 10 cc/min and a high-frequency electric power of 0.44 W/cm² in a vacuum of 0.04 Torr and subsequently was etched for 5 minutes with the plasma of argon, as shown in FIG. 22. The dry etching with $BCl_3$ removed not only the exposed part of the i-layer 45 but also the n-layer 44 and the upper part of the n+-layer 43 which were underneath the exposed part of the i-layer 45, as shown in FIG. 22.

During the etching with $BCl_3$, the $Al_2O_3$ layer 52 as a mask was etched together. The $Al_2O_3$ layer 52 and $SiO_2$ layer 51 are thick enough to remain after the etching of GaN.

When the etching of GaN is finished, the thin $Al_2O_3$ layer 52 may remain preventing the $SiO_2$ layer 51 from being exposed.

Figure 23:
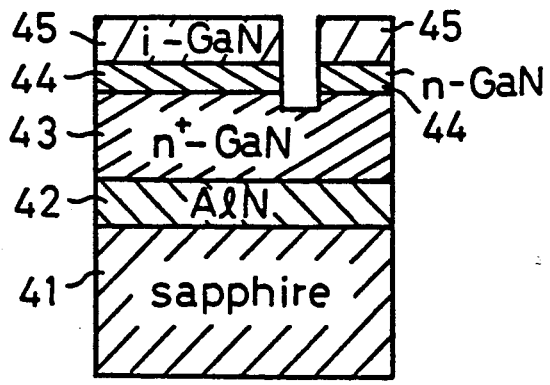

The $SiO_2$ layer 51 remaining on the i-layer 45 was removed with hydrofluoric acid as shown in FIG. 23. Even if the $Al_2O_3$ layer 52 remains on the $SiO_2$ layer 51, the Al$_2$O$_3$ layer 52 is automatically removed together with the SiO$_2$ layer 51 which is removed from the surface of the i-layer 45. The GaN layers 46, 44 and 43 resist the hydrofluoric acid in the removing process of the SiO$_2$ layer 51 and Al$_2$O$_3$ layer 52.

Figure 24:
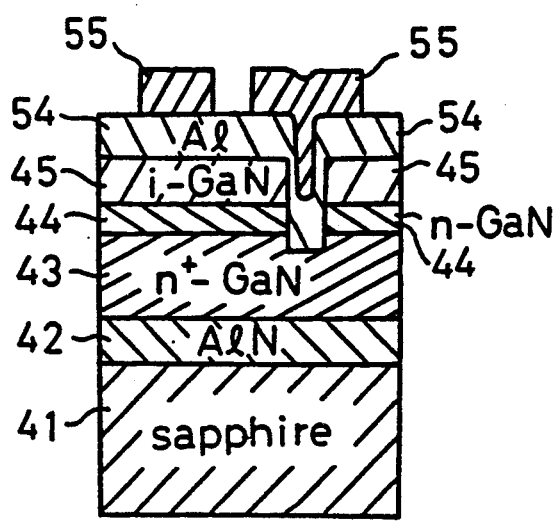

On the entire surface of the sample was formed an Al layer 54 by vapor deposition as shown in FIG. 24. On the Al layer 54 was formed a photoresist layer 55 which subsequently underwent the photolithographic processing to make a pattern corresponding to a figure of the electrodes connected to the n+-layer 43 and the i-layer 45, respectively.

The exposed part (not covered with the photoresist layer 55) of the Al layer 54 in FIG. 24 underwent etching with nitric acid. The photoresist 55 was removed with acetone. Thus there were formed the electrode 48 for the n+-layer 43 and the electrode 47 for the i-layer 45 as shown in FIG. 17.

Such an above-mentioned process could make a gallium nitride light-emitting diode of MIS (metal-insulator-semiconductor) structure as shown in FIG. 17.

In the example 3, the SiO$_2$ layer 51 and Al$_2$O$_3$ layer 52 are formed on the photoresist layer 53 and the photoresist layer 53 is removed by a solvent in order to produce a predetermined mask pattern of the SiO$_2$ and Al$_2$O$_3$ layers. Since the window A is formed by removing the photoresist layer 53, the disturbance of the window shape such as undercutting is prevented.

In etching with the plasma of BCl$_3$ and Ar, the Al$_2$O$_3$ layer 52 substantially functions as a mask. Though the growth rate of Al$_2$O$_3$ is nearly equal to that of SiO$_2$, the etched speed of Al$_2$O$_3$ is one third times lower than that of SiO$_2$. Accordingly, the total thickness of the double mask layer of SiO$_2$ and Al$_2$O$_3$ may be one third times thinner than the layer thickness in case that a mask layer is constituted of a single layer of SiO$_2$. As a result, the time for forming the mask can be shortened. Though the mask has to be removed after etching GaN, there is not a solvent for removing only Al$_2$O$_3$. Accordingly, it is hard to form the mask with only the Al$_2$O$_3$ layer. In the embodiment described above, however, since the SiO$_2$ layer 51 is used as the lowest mask layer, the mask of double layer structure can be easily removed with hydrofluoric acid.

Thus, since the SiO$_2$ layer 51 is used in order to remove the mask easily, it is possible to make the SiO$_2$ layer 51 much thinner than the Al$_2$O$_3$ layer 52.

In the light emitting diode according to the example 3 described above, an n-layer is of a double layer structure including an n-layer of low carrier concentration contacting with an i-layer and an n+-layer of high carrier concentration. The n-layer, however, may be of a single layer structure.

Also, the i-layer may be of a double layer structure including an i$_L$-layer of low impurity concentration contacting with the n-layer and an i$_H$-layer of high impurity concentration.

The blue light intensity of the light emitting diode increased on account of a double layer structure of the n-layer. And also the blue light intensity of the light emitting diode increased on account of a double layer structure of the i-layer.

What is claimed is:

1. A dry etching method for forming an etched surface to make an ohmic contact on semiconductor comprising the steps of:
   introducing a boron trichloride (BCl$_3$) etching gas into a reaction chamber under vacuum;
   applying high-frequency power to said boron trichloride (BCl$_3$) gas for producing plasma thereof;
   etching said Al$_X$Ga$_{1-X}$N ($0 \leq X \leq 1$) semiconductor with said plasma;
   successively introducing an inert gas into said reaction chamber under vacuum after etching with said plasma;
   successively applying high-frequency power to said insert gas for producing plasma of said inert gas; and
   etching an etched surface of said Al$_X$Ga$_{1-X}$N ($0 < X < 1$) semiconductor with said plasma of said inert gas after etching said Al$_X$Ga$_{1-X}$N ($0 \leq X \leq 1$) semiconductor with said plasma of said boron trichloride (BCl$_3$) gas.

2. A dry etching method for forming an etched surface to make an ohmic contact on semiconductor according to claim 1, wherein a flow rate of said inert gas is 2-30 cc/min., degree of vacuum is 0.02-0.2 Torr and said high-frequency power is 0.1-0.5 W/cm$^2$.

3. A dry etching method for forming an etched surface to make an ohmic contact on semiconductor according to claim 1, wherein said inert gas is argon (Ar).

4. A dry etching method for forming an etched surface to make an ohmic contact on semiconductor according to claim 1, wherein time of etching with said plasma of said inert gas is 2 to 15 minutes.

5. A method for forming an ohmic contact on semiconductor comprising the steps of:
   introducing a boron trichloride (BCl$_3$) etching gas into a reaction chamber under vacuum;
   applying high-frequency power to said boron trichloride ((BCl$_3$) gas for producing plasma thereof;
   etching said Al$_X$Ga$_{1-X}$N ($0 \leq X \leq 1$) semiconductor with said plasma;
   successively introducing an inert gas into said reaction chamber under vacuum after etching with said plasma;
   successively applying high-frequency power to said inert gas for producing plasma of said inert gas;
   etching an etched surface of said Al$_X$Ga$_{1-X}$N ($0 \leq X \leq 1$) semiconductor with said plasma of said inert gas after etching said Al$_X$Ga$_{1-X}$N ($0 \leq X \leq 1$) semiconductor with said plasma of said boron trichloride ((BCl$_3$) gas; and
   forming an electrode on a surface of said Al$_X$Ga$_{1-X}$N ($0 \leq X \leq 1$) semiconductor etched by said plasma of said inert gas.

6. A dry etching method for etching semiconductors comprising the steps of:
   introducing a boron trichloride (BC$_3$) etching gas into a reaction chamber under vacuum;
   applying high-frequency power to said boron trichloride (BCl$_3$) gas for producing plasma thereof; and
   etching said Al$_X$Ga$_{1-X}$N ($0 \leq X \leq 1$) semiconductor with said plasma,
   wherein a flow rate of said etching gas is 2-30 cc/min., a degree of vacuum is 0.02-0.2 Torr and said high-frequency power is 0.1-0.5 w/cm$^2$.

7. A dry etching method for etching semiconductors comprising the steps of:
   introducing a boron trichloride (BCl$_3$) etching gas into a reaction chamber under vacuum;
   applying high-frequency power to said boron trichloride (BCl$_3$) gas for producing plasma thereof; and
   etching said Al$_X$Ga$_{1-X}$N ($0 \leq X \leq 1$) semiconductor with said plasma, wherein a mask for said etching is a double layer comprising an SiO$_2$ layer formed on said semiconductor and an Al$_2$O$_3$ layer formed on said SiO$_2$ layer.

8. A dry etching method for etching semiconductors comprising the steps of:

introducing a boron trichloride (BCl$_3$) etching gas into a reaction chamber under vacuum;

applying high-frequency power to said boron trichloride (BCl$_3$) gas for producing plasma thereof; and etching said Al$_X$Ga$_{1-X}$N ($0 \leq X \leq 1$) semiconductor with said plasma, wherein a mask for said etching is a double layer comprising an SiO$_2$ layer formed on said semiconductor and a photoresist layer formed on said SiO$_2$ layer.

* * * * *